United States Patent
Lai et al.

(10) Patent No.: US 8,350,280 B2
(45) Date of Patent: Jan. 8, 2013

(54) LIGHT EMITTING DIODE WITH LIGHT CONVERSION

(75) Inventors: Chih-Ming Lai, Miao-Li Hsien (TW); Wen-Jang Jiang, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 392 days.

(21) Appl. No.: 12/622,712

(22) Filed: Nov. 20, 2009

(65) Prior Publication Data

US 2010/0148200 A1 Jun. 17, 2010

(30) Foreign Application Priority Data

Dec. 15, 2008 (CN) .......................... 2008 1 0306251

(51) Int. Cl.
  *H01L 29/06* (2006.01)
  *H01L 27/15* (2006.01)
  *H01L 31/12* (2006.01)
  *H01L 33/00* (2010.01)
  *H01L 31/0328* (2006.01)

(52) U.S. Cl. .............. 257/98; 257/79; 257/100; 257/82; 257/13

(58) Field of Classification Search .................. 257/98, 257/13, 103, 99, 79, 82, 83, 88, 89, 95, 100, 257/80
See application file for complete search history.

(56) References Cited

U.S. PATENT DOCUMENTS

| | | | | |
|---|---|---|---|---|
| 5,254,849 | A | * | 10/1993 | Murakami et al. ......... 250/208.1 |
| 7,663,307 | B2 | * | 2/2010 | Kaneko et al. ............... 313/506 |
| 2006/0263918 | A1 | * | 11/2006 | Tasaki et al. .................... 438/27 |
| 2007/0075306 | A1 | * | 4/2007 | Hayashi et al. ................. 257/13 |

FOREIGN PATENT DOCUMENTS

CN 101290959 A 10/2008

* cited by examiner

*Primary Examiner* — Chuong A. Luu
(74) *Attorney, Agent, or Firm* — Altis Law Group, Inc.

(57) ABSTRACT

An exemplary light emitting diode includes a light emitting diode chip, two optical wavelength converting layers, and an encapsulant layer. The light emitting diode chip has an light emitting surface. The light emitting diode chip is used to emit a monochromatic light from the light emitting surface. The light emitting surface includes a first region, a second region, and a third region. The two optical wavelength converting layers covers the first and the third regions of the light emitting surface. The two optical wavelength converting layers are configured for converting the monochromatic light received from the light emitting diode chip and emitting light with a converted wavelength from the light emitting diode. The encapsulant layer covers the second region of the light emitting surface for directing light therefrom.

14 Claims, 6 Drawing Sheets

LIGHT EMITTING DIODE WITH LIGHT CONVERSION

BACKGROUND

1. Technical Field

The disclosure generally relates to light emitting diodes, and particularly to a light emitting diode capable of emitting light with different colors.

2. Description of Related Art

Nowadays, light emitting diodes (LEDs) are extensively used as light sources for illumination devices due to their high luminous efficiency, low power consumption and long lifespan. A single LED generally emits monochromatic light. A plurality of LEDs with different colors and wavelengths may be employed in a single illumination device, such that the illumination device can illuminate multicolored light. However, the need to employ more than one LED makes this kind of illumination device expensive to manufacture and costly to operate.

Therefore, what is needed is a light emitting diode that overcomes the described limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Reference will now be made to the drawings to describe various embodiments of the present light emitting diode, in detail.

Figure 1:
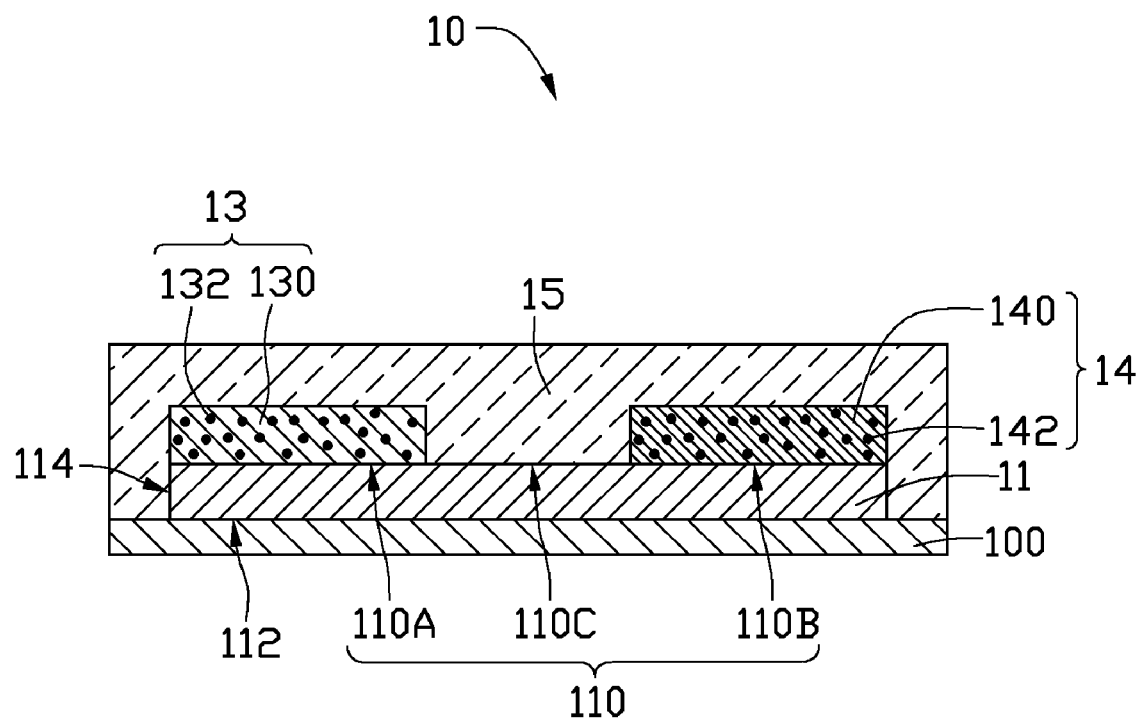
FIG. 1 is a cross-sectional view of an LED according to a first embodiment, the LED including an LED chip having a generally cuboid shape.

Referring to FIG. 1, an LED 10, according to a first embodiment, includes an LED chip 11, a first optical wavelength converting layer 13, a second optical wavelength converting layer 14, and an encapsulant layer 15.

In the illustrated embodiment, the LED chip 11 has a prismy shape, for example, a generally cuboid shape, and is provided to emit monochromatic light. In alternative embodiments, the LED chip 11 may have a generally cylindrical shape, or a general disk shape. The monochromatic light can for example be blue light having a wavelength in a range from 410 nanometers (nm) to 490 nm, for instance 465 nm. In another example, the monochromatic light can be ultraviolet (UV) light. The LED 10 may further include a substrate 100. The substrate 100 can be used as a support on which the LED chip 11 is attached. The substrate 100 can be made of material with high thermal conductivity, such as ceramic. Heat generated by the LED chip 11 can be firstly transferred to the substrate 100, and then dissipated to ambient air.

The LED chip 11 includes a top surface 110, a bottom surface 112, and a peripheral surface 114. The top surface 110 and the bottom surface 112 are substantially parallel to one another. The peripheral surface 114 interconnects the top surface 110 and the bottom surface 112. The peripheral surface 114 can be annular or generally cylindrical. The LED chip 11 is arranged on the substrate 100, with the bottom surface 112 contacting the substrate 100.

The top surface 110 includes a first region 110A, a second region 110B, and a third region 110C interconnecting the first and second regions 110A, 110B. The first optical wavelength converting layer 13 covers the first region 110A of the top surface 110. The second optical wavelength converting layer 14 covers the second region 110B of the top surface 110. The encapsulant layer 15 covers the third region 110C of the top surface 110, the peripheral surface 114, and the first and second optical wavelength converting layers 13, 14. That is, the encapsulant layer 15 and the first and second optical wavelength converting layers 13, 14 cooperatively encapsulate the LED chip 11 on the substrate 100. The encapsulant 15 prevents the LED chip 11 from being exposed to ambient air. The first and second optical wavelength converting layers 13, 14 can be made of light-pervious base material selected from the group consisting of resin, silicone, glass, epoxy, polyethylene terephthalate, polymethyl methacrylate, and polycarbonate. Similarly, the encapsulant layer 15 can be made of light-pervious material selected from the group consisting of resin, silicone, glass, epoxy, polyethylene terephthalate, polymethyl methacrylate, and polycarbonate.

The first optical wavelength converting layer 13 includes a first base material 130, and at least one first optical wavelength converting material 132 mixed (i.e., embedded) in the first base material 130. In the illustrated embodiment, the at least one optical wavelength converting material 132 is mixed essentially uniformly in the first base material 130. The at least one first optical wavelength converting material 132 is in the form of particles, and may include one kind of phosphor or different kinds of phosphors. The phosphor or phosphors can, for example, be red phosphor 132, yellow phosphor 132, green phosphor 132, or phosphors having other types of colors. The phosphor or phosphors may be comprised of one of sulfides, aluminates, oxides, silicates and nitrides. For example, the phosphor or phosphors may be $Ca_2Al_{12}O_{19}$:Mn, (Ca, Sr, Ba)$Al_2O_4$:Eu, CdS, CdTe, $Y_3Al_{15}O_{12}Ce^{3+}$(YAG), $Tb_3Al_5O_{12}$:$Ce^{3+}$(YAG), $BaMgAl_{10}O_{17}$:$Eu^{2+}$($Mn^{2+}$), $Ca_2Si_5N_8$:$Eu^{2+}$, (Ca, Sr, Ba)S:$Eu^{2+}$, (Mg, Ca, Sr, Ba)$_2SiO_4$:$Eu^{2+}$, (Mg, Ca, Sr, Ba)$_3Si_2O_7$:$Eu^{2+}$, $Y_2O_2S$:$Eu^{3+}$, $Ca_8Mg$ $(SiO_4)_4Cl_2$:$Eu^{2+}$, (Sr, Ca, Ba)$Si_xO_yN_z$:$Eu^{2+}$, (Ca, Mg, Y)Si-$wAl_xO_yN_z$:$Eu^{2+}$, or CdSe.

Similar to the first optical wavelength converting layer 13, the second optical wavelength converting layer 14 includes a second base material 140, and at least one second optical wavelength converting material 142 mixed in the second base material 140. In this embodiment, the first optical wavelength converting layer 13 has red phosphor 132 mixed in the first base material 130. The second optical wavelength converting layer 14 has green phosphor 142 mixed in the second base material 140.

In operation, the top surface 110 and the peripheral surface 114 serve as a light emitting surface of the LED chip 11. That is, the LED chip 11 emits blue light from the top surface 110 and the peripheral surface 114. The blue light emitted from the third region 110C of the top surface 110 and the peripheral surface 114 transmits directly through the encapsulant layer 15. The first and second optical wavelength converting layers 13, 14 receive the blue light emitted from the corresponding first and second regions 110A, 110B, and convert the wavelength of the blue light accordingly. For example, the red phosphor 132 of the first optical wavelength converting layer 13 absorbs blue light emitted from the LED chip 11, and converts the wavelength of the blue light into the wavelength of red light to a certain degree. The blue light and the red light mix to form light having different colors or/and chromas. In another example, the blue light is completely absorbed by the red phosphor 132 of the first optical wavelength converting layer 13, with the wavelength of the blue light being completely converted into the wavelength of red light. For the second optical wavelength converting layer 14, the green phosphor 142 of the second optical wavelength converting layer 14 absorbs blue light emitted from the LED chip 11, and converts the wavelength of the blue light into the wavelength of green light to a certain degree. Alternatively, the blue light is completely absorbed by the green phosphor 142 of the second optical wavelength converting layer 14, with the wavelength of the blue light being completely converted into the wavelength of green light. In a typical application, the blue light transmitted through the encapsulant layer 15, the red light emitted from the first optical wavelength converting layer 13, and the green light emitted from the second optical wavelength converting layer 14 may mix to form colorful light having different colors or/and chromas.

In alternative embodiments, the first and second optical wavelength converting layers 13, 14 may each include a plurality of different phosphors 132/142 mixed in the base materials 130/140 thereof, respectively. For example, the first optical wavelength converting layer 13 may include green phosphor 132, red phosphor 132, and yellow phosphor 132 mixed in the first base material 130; and the second optical wavelength converting layer 14 may include green phosphor 142, red phosphor 142, and yellow phosphor 142 mixed in the second base material 140. In such case, the wavelength of the blue light may be converted into the wavelengths of a plurality of other different colored light, for example, green light, red light, and yellow light, in the first and second optical wavelength converting layers 13, 14. The blue light transmitted through the encapsulant layer 15, the green light, the red light, and the yellow light may mix to form light having different colors or/and chromas.

In yet other alternative embodiments, the first and second optical wavelength converting layers 13, 14 may include a same phosphor 132/142 mixed in both the base materials 130, 140 thereof, but with the concentration of each such same phosphor 132/142 being different in the two base materials 130, 140. For example, the first optical wavelength converting layer 13 includes red phosphor 132 mixed in the first base material 130, and the second optical wavelength converting layer 14 also includes red phosphor 142 mixed in the second base material 140. The concentration of the red phosphor 132 mixed in the first base material 130 is different from that of the red phosphor 142 mixed in the second base material 140. In operation, the red phosphor 132 in the first base material 130 and the red phosphor 142 in the second base material 140 may absorb the blue light, and convert the wavelength of the blue light to different degrees. Thus, the LED 10 may emit light having different colors or/and chromas.

Figure 2:
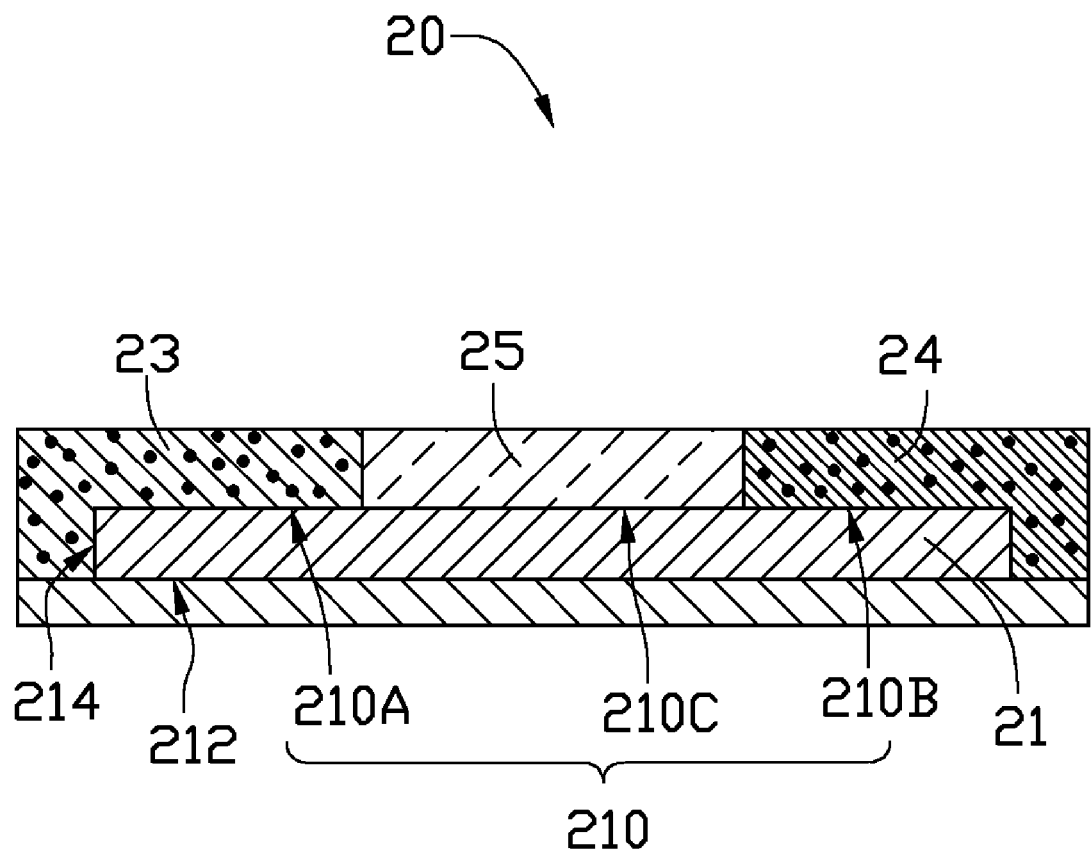
FIG. 2 is a cross-sectional view of an LED according to a second embodiment, the LED including an LED chip having a generally cuboid shape.

Referring to FIG. 2, an LED 20, according to a second embodiment, includes an LED chip 21, a first optical wavelength converting layer 23, a second optical wavelength converting layer 24, and an encapsulant layer 25. The LED chip 21 includes a top surface 210, a bottom surface 212, and a peripheral surface 214. The top surface 210 includes a first region 210A, a second region 210B, and a third region 210C.

The LED 20 is similar to the LED 10 of the first embodiment. However, for the LED 20, the first optical wavelength converting layer 23 extends from the first region 210A to cover part of the peripheral surface 214, and the second optical wavelength converting layer 24 extends from the second region 210B to cover part of the peripheral surface 214. The first and second optical wavelength converting layers 23, 24 cooperatively cover the whole peripheral surface 214. The encapsulant layer 25 only covers the third region 210C of the top surface 210. The first and second optical wavelength converting layers 23, 24 receive, inter alia, the light emitted from the peripheral surface 214, and convert the wavelength of such light accordingly.

Figure 3:
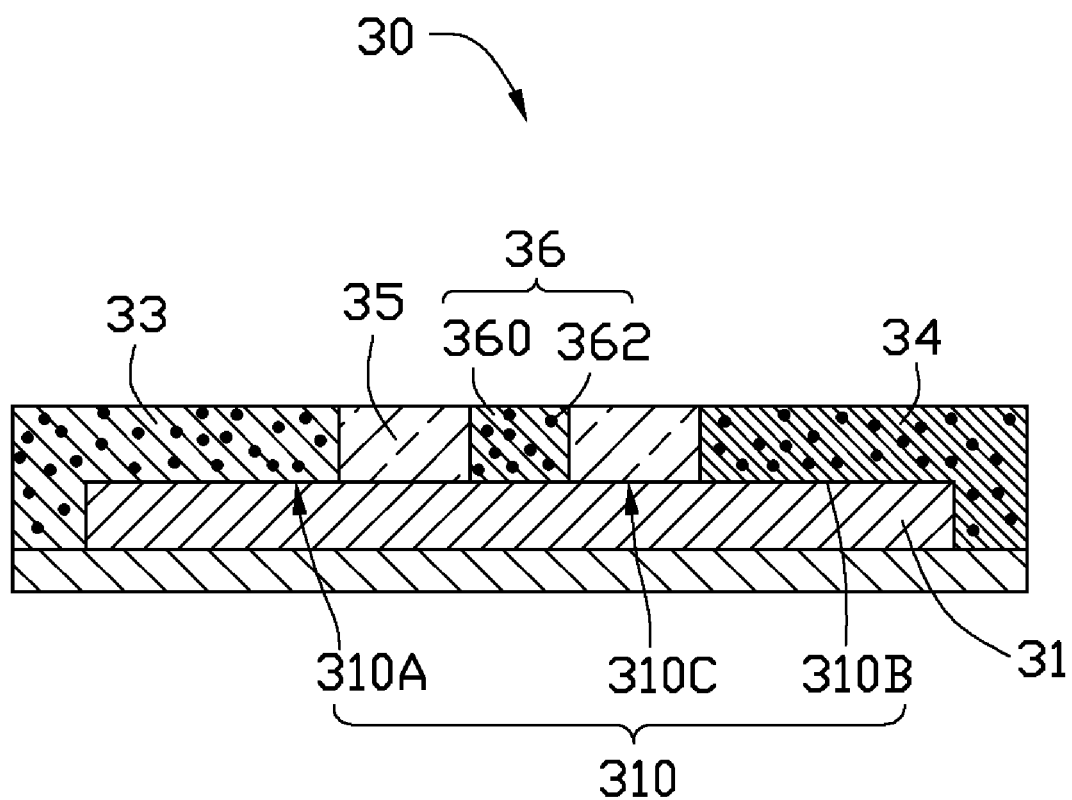
FIG. 3 is a cross-sectional view of an LED according to a third embodiment, the LED including an LED chip having a generally cuboid shape.

Referring to FIG. 3, an LED 30, according to a third embodiment, includes an LED chip 31, a first optical wavelength converting layer 33, a second optical wavelength converting layer 34, and an encapsulant layer 35. The LED chip 31 includes a top surface 310 at an upper side thereof. The top surface 310 includes a first region 310A, a second region 310B, and a third region 310C.

The LED 30 is similar to the LED 20 of the second embodiment. However, for the LED 30, a third optical wavelength converting layer 36 is further provided to cover a central part of the third region 310C. The third optical wavelength converting layer 36 includes a third base material 360, and a yellow phosphor 362 mixed in the third base material 360. In typical operation of the LED 30, the first optical wavelength converting layer 33 receives blue light from the LED chip 31, and converts the wavelength of the blue light into the wavelength of red light. The second optical wavelength converting layer 34 receives blue light from the LED chip 31, and converts the wavelength of the blue light into the wavelength of green light. The third optical wavelength converting layer 36 receives blue light emitted from the central part of the third region 310C, and converts the wavelength of blue light into the wavelength of yellow light to a certain degree. The blue light, red light, green light, and yellow light mix to form light having different colors or/and chromas.

Figure 4:
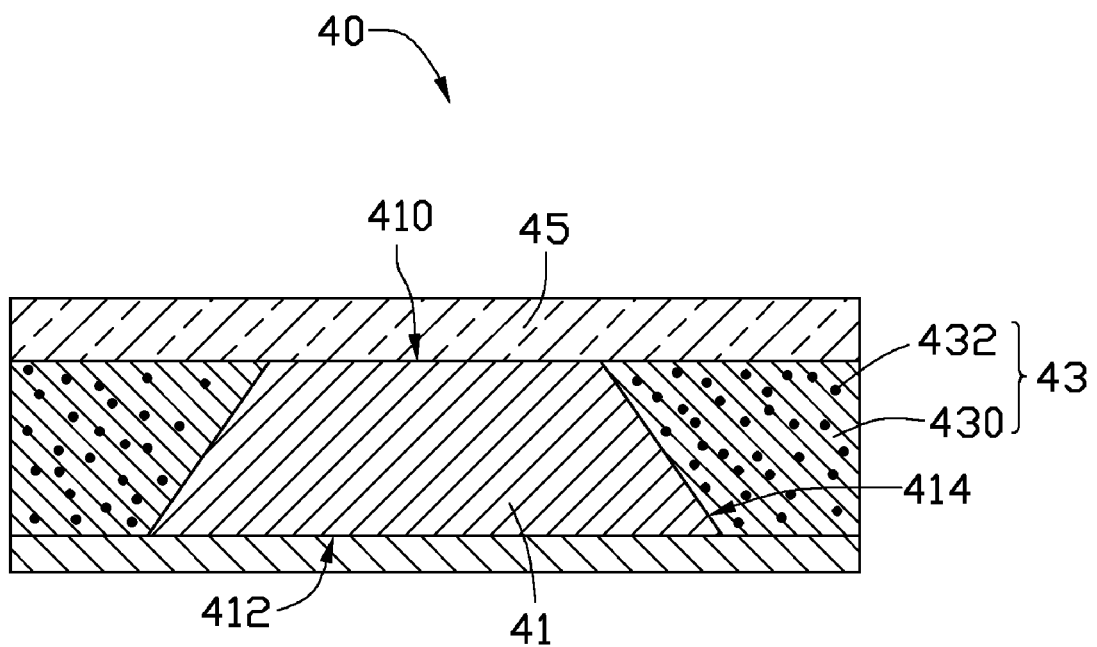
FIG. 4 is a cross-sectional view of an LED according to a fourth embodiment, the LED including an LED chip having a frusto-conical shape.

Referring to FIG. 4, an LED 40, according to a fourth embodiment, includes an LED chip 41, an encapsulant layer 45, and only one optical wavelength converting layer 43. The LED chip 41 includes a top surface 410, a bottom surface 412, and a peripheral surface 414. The LED 40 is similar to the LED 10 of the first embodiment. However, for the LED 40, the LED chip 41 has a frusto-conical shape. In the illustrated embodiment, the LED chip 41 may be circular frusto-conical shaped, and tapers from the bottom surface 412 to the top surface 410. Accordingly, the peripheral surface 414 is a kind of annular frusto-conical surface. In alternative embodiments, the LED chip 41 may be rectangular frusto-conical shaped, and taper from the bottom surface 412 to the top surface 410. The optical wavelength converting layer 43 covers the whole peripheral surface 414. The encapsulant layer 45 covers the top surface 410, and a top surface of the optical wavelength converting layer 43. The optical wavelength converting layer 43 includes a base material 430, and a green phosphor 432 mixed essentially uniformly in the base material 430.

In typical operation of the LED 40, the top surface 410 and the peripheral surface 414 serve as a light emitting surface of the LED chip 41. The optical wavelength converting layer 43 receives blue light emitted from the peripheral surface 414, and converts the wavelength of the blue light to the wavelength of green light to a certain degree. The green light transmits through the encapsulant layer 45 and/or mixes with the blue light emitted from the top surface 410, thereby forming light having different colors or/and chromas.

Figure 5:
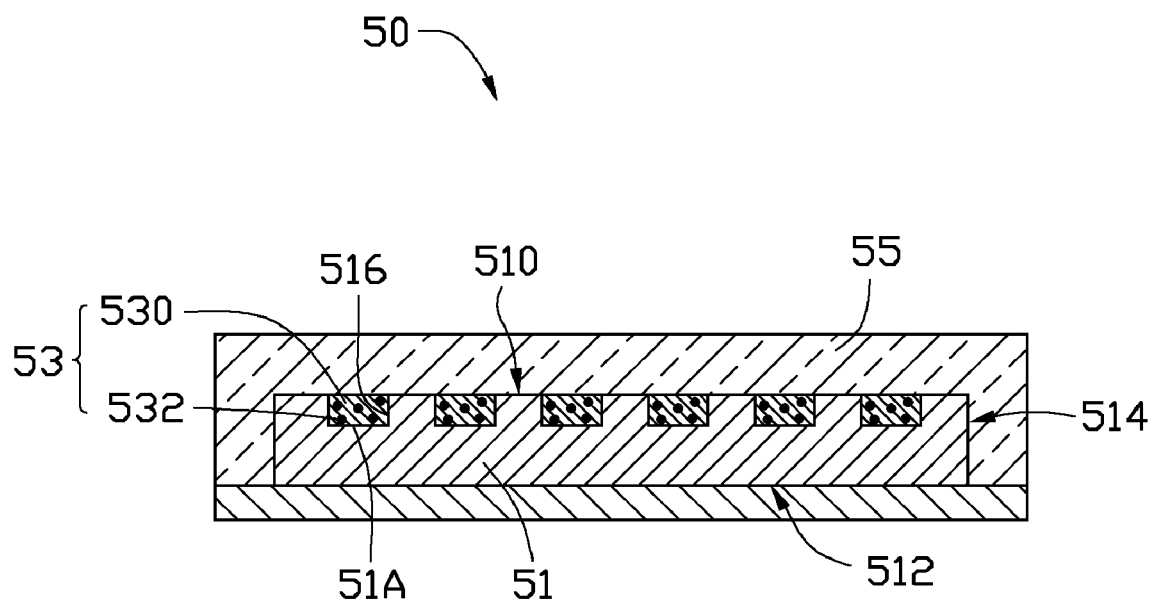
FIG. 5 is a cross-sectional view of an LED according to a fifth embodiment, the LED including an LED chip with generally cuboid-shaped grooves defined therein.

Referring to FIG. 5, an LED 50, according to a fifth embodiment, includes an LED chip 51, a plurality of optical wavelength converting layers 53, and an encapsulant layer 55. The LED chip 51 is similar in structure to the LED chip 11 of the first embodiment, and includes a top surface 510, a bottom surface 512, and a peripheral surface 514. The LED 51 may have one of a generally cuboid shape, a generally cylindrical shape, and a general disk shape.

The optical wavelength converting layers 53 are similar in principle to the optical wavelength converting layers 13, 14 of the first embodiment. However, for the LED 50, a plurality of grooves 51A are defined in the top surface 510, and each of the grooves 51A is filled with a base material 530. In the illustrated embodiment, the grooves 51A are substantially evenly distributed throughout the top surface 510. Optical wavelength converting material 532 is mixed in the base material 530. The encapsulant layer 55 covers the top surface 510, the peripheral surface 514, and the optical wavelength converting layers 53. In this embodiment, the LED chip 51 emits blue light, and the optical wavelength converting material 532 is green phosphor.

In typical operation of the LED 50, the top surface 510, the peripheral surface 514, and a plurality of inner surfaces 516 in the separated grooves serve as light emitting surfaces of the LED chip 51. The optical wavelength converting layer 53 receives blue light emitted from the inner surfaces 516, and converts the wavelength of the blue light to the wavelength of green light to a certain degree. The green light transmits through the encapsulant layer 55 and/or mixes with the blue light emitted from the top surface 510 and the peripheral surface 514, thereby forming light having different colors or/and chromas.

Figure 6:
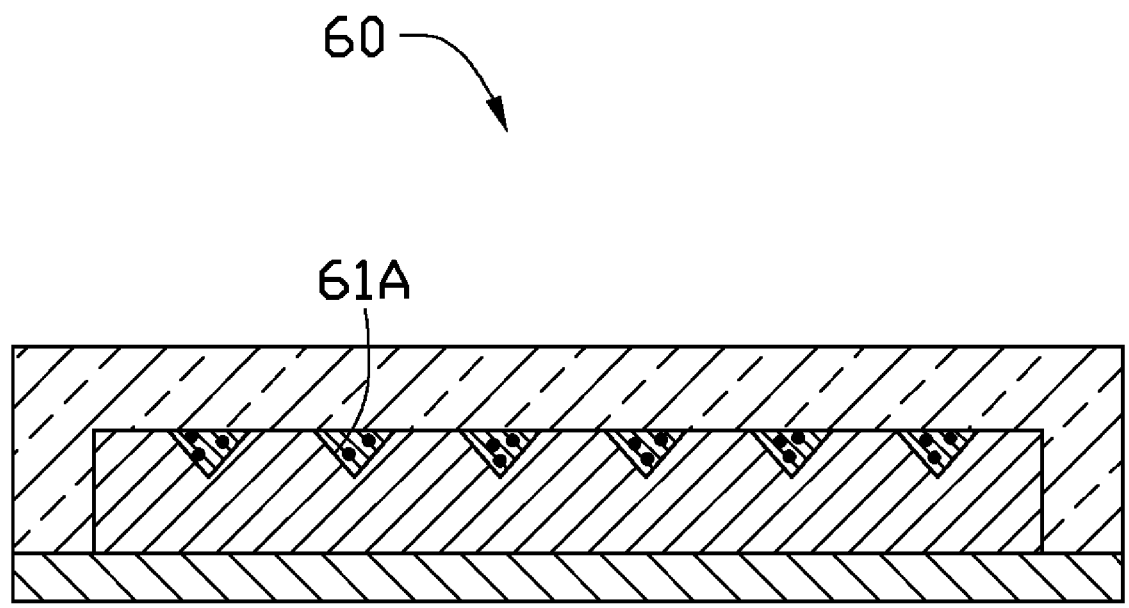
FIG. 6 is a cross-sectional view of an LED according to a sixth embodiment, the LED including an LED chip with conical grooves defined therein.

In the illustrated embodiment, each groove 51A may have a cuboid shape or a generally cylindrical shape. For example, the cuboid shape may have a square transverse cross section taken parallel to the top surface 510. In another alternative embodiment as shown in FIG. 6, a light emitting diode 60 is similar to the light emitting diode 50. However, for the light emitting diode 60, each groove 61A has a conical shape, which has a triangular transverse cross section. In other alternative embodiments, the grooves 51A may have other suitable shapes, such as frusto-conical shapes, etc.

In summary, each of the LEDs 10~60 is equipped with at least one optical wavelength converting layer and an encapsulant layer. Monochromatic light from the LED chip may transmit through the encapsulant layer. The monochromatic light can also be converted into light of other wavelengths by the at least one optical wavelength converting layer. The monochromatic light and the converted light can be mixed to form light having different colors or/and chromas. Thus the LEDs 10~60 can provide rich and colorful illuminating effects as desired.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A light emitting diode, comprising:
a light emitting diode chip having a light emitting surface, the light emitting diode chip capable of emitting monochromatic light from the light emitting surface, the light emitting surface comprising at least one first output region and at least one second output region;
at least one optical wavelength converting layer covering the at least one first output region of the light emitting surface, the at least one optical wavelength converting layer being configured for converting the monochromatic light received from the light emitting diode chip and emitting light with a converted wavelength from the light emitting diode; and
at least one light-pervious encapsulant layer covering at least the at least one second output region of the light emitting surface wherein the light emitting diode has one of a generally prismy shape, a generally cylindrical shape, a general disk shape, the light emitting diode includes a top surface, a bottom surface substantially parallel to the top surface, and a peripheral surface interconnecting the top surface and the bottom surface, the light emitting surface comprises the top surface and the peripheral surface, and the at least one first output region is comprised in at least part of the top surface.

2. The light emitting diode of claim 1, wherein the at least one optical wavelength converting layer comprises a light-pervious base material, and at least one optical wavelength converting material essentially uniformly distributed throughout the base material.

3. The light emitting diode of claim 2, wherein the optical wavelength converting material is phosphor selected from the group consisting of sulfides, aluminates, oxides, silicates and nitrides.

4. The light emitting diode of claim 3, wherein the at least one optical wavelength converting layer comprises a plurality of optical wavelength converting layers, and the optical wavelength converting material of each of the optical wavelength converting regions is a phosphor different from the phosphor of each other optical wavelength converting region.

5. The light emitting diode of claim 3, wherein the at least one optical wavelength converting layer comprises a plurality of optical wavelength converting layers, the optical wavelength converting material of all of the optical wavelength converting regions is the same phosphor, and each optical wavelength converting region has a concentration of the phosphor different from that of each other optical wavelength converting region.

6. The light emitting diode of claim 2, wherein the base material of the at least one optical wavelength converting layer is selected from the group consisting of resin, silicone, polyethylene terephthalate, polymethyl methacrylate, and polycarbonate.

7. The light emitting diode of claim 1, wherein material of the at least one encapsulant layer is selected from the group consisting of resin, silicone, glass, polyethylene terephthalate, polymethyl methacrylate, and polycarbonate.

8. The light emitting diode of claim 1, wherein the light emitting diode chip is a blue light emitting diode chip.

9. A light emitting diode, comprising:
a light emitting diode chip having an output surface, the light emitting diode chip capable of emitting monochromatic light from the output surface;
a light-pervious layer covering the output surface; and
at least one optical wavelength converting material distributed in the light-pervious layer substantially above only part of the output surface, the at least one optical wavelength converting material being configured for converting the monochromatic light received from the light emitting diode chip and emitting light with a converted wavelength from the light emitting diode wherein the light emitting diode has one of a generally prismy shape, a generally cylindrical shape, a general disk shape, the light emitting diode includes a top surface, a bottom surface substantially parallel to the top surface, and a peripheral surface interconnecting the top surface and the bottom surface, the light emitting surface comprises the top surface and the peripheral surface, and the at least one first output region is comprised in at least part of the top surface.

10. The light emitting diode of claim 9, wherein the at least one optical wavelength converting material is essentially uniformly distributed at said only part of the output surface.

11. The light emitting diode of claim 10, wherein said only part of the output surface comprises a plurality of discrete parts of the output surface, and the at least one optical wavelength converting material is essentially uniformly distributed at each of said discrete parts of the output surface.

12. The light emitting diode of claim 9, wherein the light emitting diode chip is a blue light emitting diode chip.

13. The light emitting diode of claim 9, wherein the at least one optical wavelength converting material is phosphor selected from the group consisting of sulfides, aluminates, oxides, silicates and nitrides.

14. The light emitting diode of claim 9, wherein the light-pervious layer is made of material selected from the group consisting of resin, silicone, polyethylene terephthalate, polymethyl methacrylate, and polycarbonate.

* * * * *